(12) United States Patent
Lee et al.

(10) Patent No.: US 6,330,908 B1
(45) Date of Patent: Dec. 18, 2001

(54) HEAT SINK

(75) Inventors: Hsieh Kun Lee, Chung-Ho; Don-Yun Lee, Tu-chen, both of (TW)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/605,131

(22) Filed: Jun. 27, 2000

(30) Foreign Application Priority Data

Mar. 15, 2000 (TW) ................................................ 089204149

(51) Int. Cl.$^7$ ...................................................... F28F 7/00
(52) U.S. Cl. ........................ 165/185; 165/80.3; 361/697; 361/704; 361/709; 174/16.3; 257/722
(58) Field of Search .................................. 165/80.3, 185, 165/104.33, 80.2; 361/704, 710, 678, 687, 688, 697, 702, 703, 709, 711; 257/719, 722; 174/16.3

(56) References Cited

U.S. PATENT DOCUMENTS

| | | | |
|---|---|---|---|
| 2,745,895 | * 5/1956 | Lideen | 165/185 |
| 2,917,286 | * 12/1959 | Deakin | 165/80.3 |
| 3,023,264 | * 2/1962 | Allison | 165/185 |
| 3,152,217 | * 10/1964 | Balchaitis | 165/185 |
| 3,185,756 | * 5/1965 | Allison | 165/185 |
| 3,260,787 | * 7/1966 | Finch | 165/185 |
| 3,372,733 | * 3/1968 | Callender | 165/80.3 |
| 5,019,940 | * 5/1991 | Clemens | 165/80.3 |
| 5,375,652 | * 12/1994 | Matsunaga et al. | 165/185 |
| 5,412,535 | * 5/1995 | Chao et al. | 361/700 |
| 5,784,255 | * 7/1998 | Wyland | 174/16.3 |
| 5,794,685 | * 8/1998 | Dean | 165/80.3 |
| 6,199,625 | * 3/2001 | Guerrero | 165/185 |
| 6,209,623 | * 4/2001 | Tantoush | 165/80.3 |

* cited by examiner

Primary Examiner—James C. Yeung
Assistant Examiner—Terrell McKinnon
(74) Attorney, Agent, or Firm—Wei Te Chung

(57) ABSTRACT

A heat sink includes a base (20) and a number of fins (30). The base includes a bottom plate (21) to be positioned on and in contact with an electronic package, such as a central processing unit, and a column (22) extending from the bottom plate opposite the electronic package. The fins are attached to the column and radially extend therefrom. A gap is formed between the fins and the plate of the base for facilitating air flow through the heat sink. A curved surface (23) may be formed between the column and the base for guiding the air flow away from the fins.

17 Claims, 2 Drawing Sheets

HEAT SINK

BACKGROUND

1. Field of the Invention

The present invention relates to a heat sink, and particularly to a heat sink which reduces resistance to air flowing therethrough.

2. The Related Art

An electronic device, such as a Central Processing Unit (CPU), generates a large amount of heat during operation. Unless the heat is efficiently dissipated, operating stability of the device will be diminished. To assure stable operation, a heat sink is often mounted to a CPU to aid in dissipating heat therefrom.

A conventional heat sink comprises a plane base positioned on and in contact with an electronic device from which heat is to be removed, and a plurality of fins extending from the base. A fan is often mounted to the fins to cause air to flow through the fins and toward the base, thereby establishing a forced convection and thus more efficiently removing heat from the electronic device. However, the air flow has a tendency to rebound from the base since the base is plane, and this reduces the efficiency of the forced convection. Examples of convention heat sinks are disclosed in Taiwan Patent Application No. 84201742 and U.S. Pat. No. 5,421,406.

Thus, a heat sink which overcomes the above-described problems is desired.

SUMMARY OF THE INVENTION

Accordingly, an object of the present invention is to provide a heat sink which dissipates heat efficiently.

Another object of the present invention is to provide a heat sink wherein a gap is formed between fins of the heat sink and a plate thereof to promote air flow through the heat sink and thus enhance heat convection.

A further object of the present invention is to provide a heat sink comprising a fan for generating air flow, the air flow being guided by a curved surface on the heat sink for reducing resistance against air flowing through the heat sink.

A further object of the present invention is to provide a heat sink promoting a smoother flow of air therethrough, thereby enhancing operation thereof.

To achieve the above-mentioned objects, a heat sink in accordance with the present invention comprises a base and a number of fins. The base comprises a bottom plate to be positioned on and in contact with an electronic package and a column extending from the bottom plate opposite the electronic package. The fins are arranged in a ring and extend radially from the column. A lower edge of the fins is distanced from the bottom plate by a gap therebetween to facilitate the flow of air through the heat sink. A curved surface may be formed between the column and the base for guiding the air flow away from the fins.

Other objects, advantages and novel features of the present invention will be drawn from the following detailed embodiment of the present invention with attached drawings, in which:

DESCRIPTION OF THE PREFERRED EMBODIMENT

Figure 1:
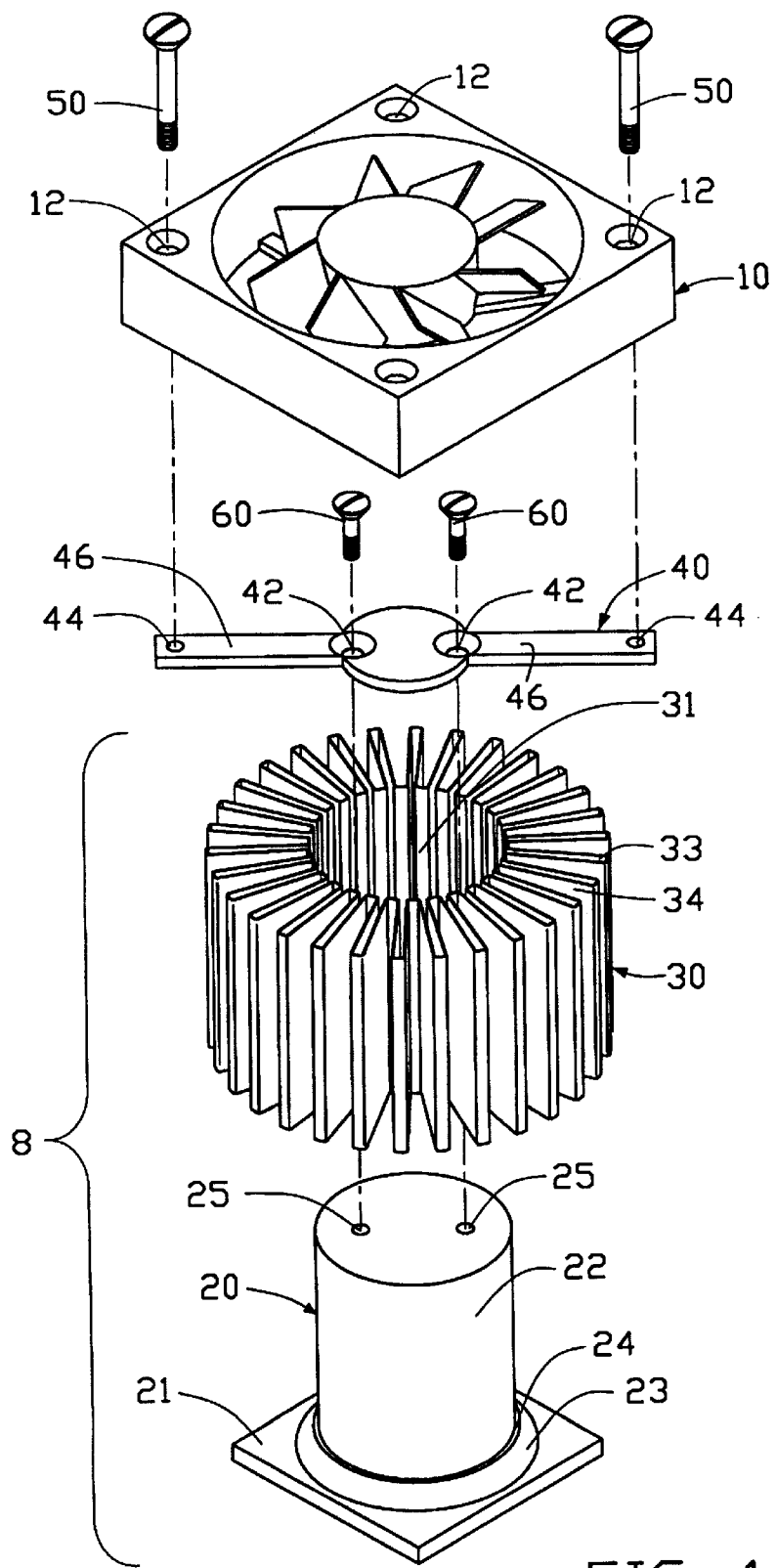
FIG. 1 is an exploded view of a heat sink constructed in accordance with the present invention.
Figure 2:
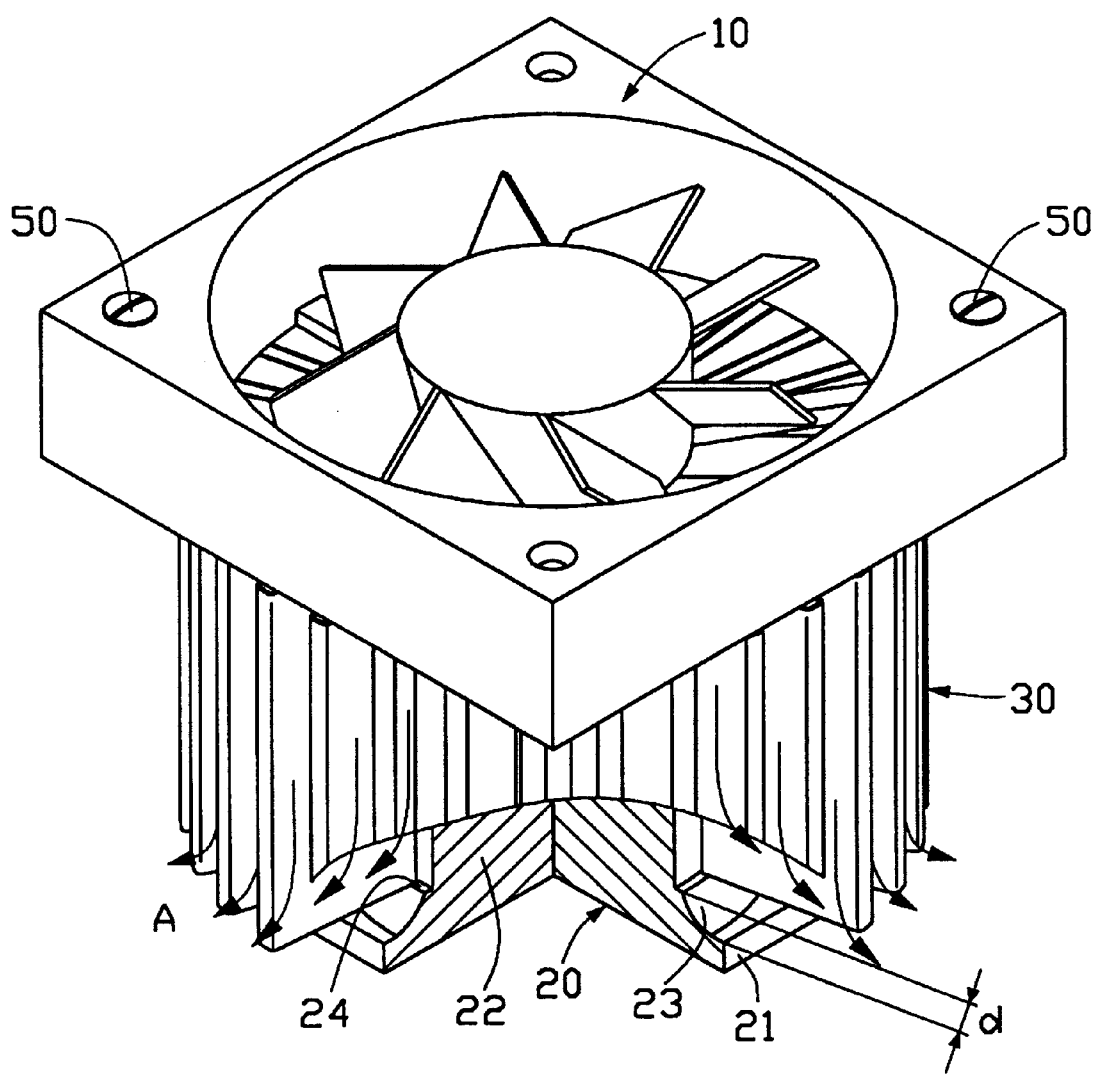
FIG. 2 is an assembled view of FIG. 1.

Referring to FIGS. 1 and 2, a heat sink 8 of the present invention includes a base 20 and a plurality of fins 30 mounted to the base 20. The base 20 includes a heat-conductive bottom plate 21, preferably rectangular in shape, positioned on and in contact with an electronic package (not shown) or the like which is to be cooled, and a cylindrical column 22, solid in construction and made of a heat-conductive material, perpendicularly extending from the plate 21 opposite the electronic package. A pair of screw holes 25 is defined in a top surface of the column 22. A gusset 23 with a curved surface is formed at the junction between the plate 21 and the outer wall of the column 22. A circumferential shoulder 24 is formed on the gusset 23 for supporting the fins 30 thereon.

The fins 30 are radially arranged in a ring shape to define a central receiving hole 31 for closely receiving the column 22 of the base 20 therein. The fins 30 are spaced from each other in a circumferential direction whereby a clearance 34 is formed between adjacent fins 30. The fins 30 may be formed by bending a metallic plate or fixing a plurality of plates together. In the embodiment illustrated, the fins 30 are formed by bending a continuous metal plate whereby each fin 30 is U-shaped and defines a slot 33 therein.

In assembly, the fins 30 is fit over the column 22 of the base 20 with a bottom edge of the fins 30 abutting against and thus supported by the shoulder 24 of the gusset 23. The fins 30 is connected to an outer surface of the column 22 by any known means, such as a heat-conductive adhesive, whereby heat is effectively transferred between the fins 30 and the base 20. The gusset 23 separates the fins 30 from the bottom plate 21 of the base 20 by a distance "d", thereby facilitating air circulation. The curved surface of the gusset 23 serves to guide air flow away from the fins 30.

A fastening piece 40 is attached to the top surface of the column 22 by a pair of bolts 60 extending through holes 42 defined in the fastening piece 40 and threadedly engaging with the screw holes 25 defined in the column 22. The fastening piece 40 comprises a pair of arms 46 extending in opposite directions, each defining an inner-threaded aperture 44. A fan 10 is mounted to the fastening piece 40 by screws 50 extending through holes 12 of the fan 10 and threadedly engaging with the apertures 44.

The operation of the fan 10 causes air to flow through slots 33 and clearances 34 between the fins 31 in a direction substantially parallel to the column 22. The curved surface of the gusset 23 facilitates guiding the air flow in and out of the fins 30.

It is understood that the invention may be embodied in other forms without departing from the spirit thereof. Thus, the present example and embodiment are to be considered in all respects as illustrative and not restrictive, and the invention is not to be limited to the details given herein.

What is claimed is:

1. A heat sink comprising:

a heat-conductive base comprising a plate adapted to be positioned on and in contact with a heat generating device a column extending from the plate opposite the heat generating device; and a plurality of heat-conductive fins arranged radially and attached to the column, a fan mounted to a top surface of the column for generating a forced air flow through the fins; and a gap between a bottom end of the fins and a top surface of the plate of the base for providing an air flow path.

2. The heat sink as described in claim 1, wherein the column is cylindrical in shape and formed of a solid, heat-conductive material.

3. The heat sink as described in claim 1, wherein a gusset having a curved surface is formed at the juncture between the plate and an outside wall of the column for guiding the air flow away from the fins.

4. The heat sink as described in claim 3, wherein a circumferential shoulder is formed on the gusset for positioning and supporting the fins thereon.

5. The heat sink as described in claim 1, wherein the fins are made by bending one continuous plate, each fin being U-shaped and defining a slot therein.

6. The heat sink as described in claim 2, wherein the fins are arranged in a ring shape and define a receiving hole at a center of the ring shape for receiving the column of the base therein.

7. The heat sink as described in claim 1, wherein a clearance is formed between adjacent fins.

8. A heat sink assembly comprising:
   a base comprising a plate and a column extending from the plate, a gusset being formed between the plate and the column;
   a plurality of fins attached to an outer surface of the column, the fins being supported by the gusset thus spacing away from the plate; and
   a fastening piece is fixed to a top end of the column for supporting a fan generating a forced air flow through the fins and a gap defined between the fins and the plate.

9. The heat sink assembly as described in claim 8, wherein the gusset has a curved surface for guiding the air flow.

10. The heat sink assembly as described in claim 8, wherein a circumferential shoulder is formed on the gusset for positioning and supporting the fins to keep the fins spacing away from the plate of the base.

11. The heat sink assembly as described in claim 8, wherein each fin is U-shaped defining a slot therein.

12. The heat sink assembly as described in claim 8, wherein the fins are arranged in a ring shape to define a receiving hole for receiving the column of the base therein.

13. The heat sink assembly as described in claim 8, wherein a clearance is defined between adjacent fins.

14. The heat sink assembly as described in claim 9, wherein a pair of arms each having an inner-threaded aperture extends in opposite directions from the fastening piece, the fan having through holes corresponding to the apertures of the extending arms for receiving bolts threadingly engaging a corresponding aperture to secure the fan to the fastening piece.

15. The heat sink assembly as described in claim 8, wherein the fins radially extend from the column.

16. The heat sink assembly as described in claim 8, wherein the fins are attached to the column by adhesives.

17. A heat sink assembly comprising:
   a heat-conductive base including a plate and a column upwardly extending therefrom a distance;
   a plurality of radial heat-conductive fins arranged in a ring shape surrounding the column, to restrain radial movement of the fins relative to the base, with a vertical dimension same as said distance so as to have a top surface of the column be adjacent to top faces of said fins;
   a planar fastener attached to the top surface of the column and abutting against the top faces of the fins so as to restrain vertical movement of the fins relative to the base; and
   a fan retained to and positioned on the fastener.

* * * * *